United States Patent [19]

Cresswell et al.

[11] Patent Number: 5,602,492

[45] Date of Patent: Feb. 11, 1997

[54] ELECTRICAL TEST STRUCTURE AND METHOD FOR MEASURING THE RELATIVE LOCATIONS OF CONDUCTING FEATURES ON AN INSULATING SUBSTRATE

[75] Inventors: Michael W. Cresswell, Frederick; Loren W. Linholm, Ijamsville; Richard A. Allen, Germantown; E. Clayton Teague, Gaithersburg; William B. Penzes, New Carrollton, all of Md.

[73] Assignee: The United States of America as represented by the Secretary of Commerce, Washington, D.C.

[21] Appl. No.: 236,202

[22] Filed: Apr. 28, 1994

Related U.S. Application Data

[63] Continuation-in-part of Ser. No. 852,439, Mar. 13, 1992, Pat. No. 5,383,136.

[51] Int. Cl.$^6$ ............................ G01R 31/02; G01R 27/08
[52] U.S. Cl. ................................ 324/763; 324/716
[58] Field of Search .................. 324/716, 763, 324/158.1, 765, 500, 537; 364/561, 562; 257/40, 48

[56] References Cited

U.S. PATENT DOCUMENTS

| | | |
|---|---|---|
| 3,974,443 | 8/1976 | Thomas . |
| 4,516,071 | 5/1985 | Buehler . |
| 4,672,314 | 6/1987 | Kokkas . |
| 4,810,335 | 3/1987 | Heiber . |
| 4,918,377 | 4/1990 | Buehler et al. . |
| 4,983,908 | 1/1991 | Tada et al. . |
| 5,015,323 | 5/1991 | Gallagher . |

OTHER PUBLICATIONS

Beuhler et al., "Bridge and van der . . . ", *J. Electrochem Soc., vol. 125, No. 4, Apr. 1978. pp. 650–654, 1978.*
C. J. Ashton, "Differential Linewidth . . . ", *SPIE*, vol. 775, p. 201, Mar. 1987.

B. Fay, "Electrical Measurement Techniques . . . ", *Solid State Technology* pp. 239–243, May 1986.
D. S. Perloff, "A Van der Pauw Resistor . . . ", *Solid State Electronics*, vol. 21, pp. 1013–1018, Jan. 1978.

(List continued on next page.)

*Primary Examiner*—Kenneth A. Wieder
*Assistant Examiner*—Russell M. Kobert
*Attorney, Agent, or Firm*—Michael de Angeli

[57] ABSTRACT

A test structure for submicrometer metrology as used in integral circuit manufacture comprises a bridge conductor divided into three segments by pairs of voltage taps. A first segment has no intermediate taps; a second segment has a number of dummy taps intermediate its ends; and a third segment has a single central tap, which may typically be formed in a different step than the remainder of the test structure, intermediate its ends. Preferably, the central tap extends from the same side of the bridge conductor as the taps at the ends of the third segment thereof. In order to evaluate a manufacturing operation, for example, to monitor the accuracy of registration of successive manufacturing steps, test signals are applied successively between the pairs of pads. Comparison of the response of the first and second segments to the test signals allows evaluation of the segment-shortening effect of the taps; comparison of the response of the two portions of the third segment to the test signals allows evaluation of their lengths, and thus of the offset, that is, the accuracy of registration of the step used to form the central tap.

A plurality of substantially identical test structures are formed, for example, on an integrated circuit substrate. Offsets measured with respect to each of the substrates are summed using a least-squares technique, to allow separation of tool-wide misalignment errors and errors in the generation of a particular pattern or similar tool used to form a test structure. By summing the offsets measured with respect to a large number of test structures, random errors due to the presence of dust or other contaminants on the tools are effectively eliminated.

3 Claims, 7 Drawing Sheets

OTHER PUBLICATIONS

D. R. Thomas et al., "An Electrical Photolithographic . . .", *Digest of Papers* Government Microcircuit Applications Conferecne, pp. 196–197, Jun. 1974.

T. J. Russell, "A Comparison of Electrical . . .", *Technical Digest*, IEDM, pp. 1–3, Dec. 5–7, 1977.

J. J. La Brie, "Characterization of Two Level . . .", *SPIE*, vol. 775, Mar. 1987 pp. 195–200.

Troccolo, "Extending Electrical Measurements . . .", *SPIE*, vol. 1441 pp. 90–103.

Yen, et al. "A Cross Bridge Test Structure . . .", *J. Electrochem. Soc.:* Soli Solid–State Science and Technology, 129, No. 10, Oct. 1982, pp. 2313–2318.

Buehler, Martin, et al. "The Split–Cross Bridge . . .", *IEEE Transactions on Electron Devices*, ED–33, No. 10, Oct. 1986, pp. 1572–1579.

Feldbaumer, et al. "Design & Application of the Interlayer . . .", *IEEE Transactions on Semiconductor Manufacturing*, 3, No. 4, Nov. 1990.

Cresswell et al., "A Modified Sliding Wire . . .", *IEEE International Conference on Microelectronic Test Structures*, 4, No. 1, Mar. 1991.

Kuroki et al., "X–ray Exposure Mask . . .", *IEEE ICMTS*, 4, No. 1, Mar. 1991.

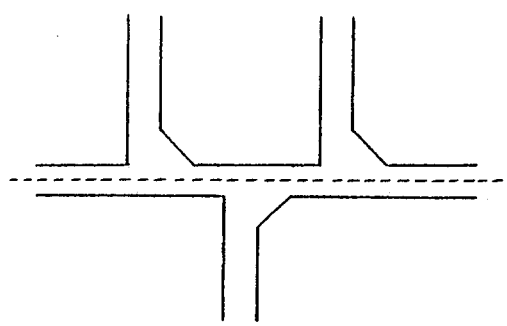
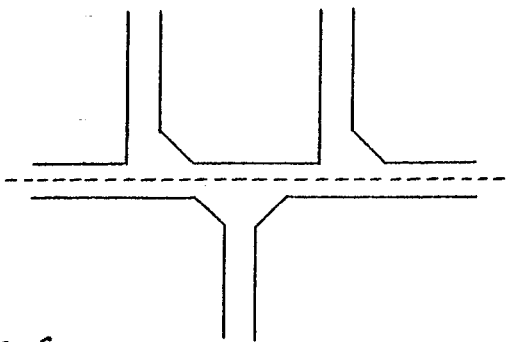
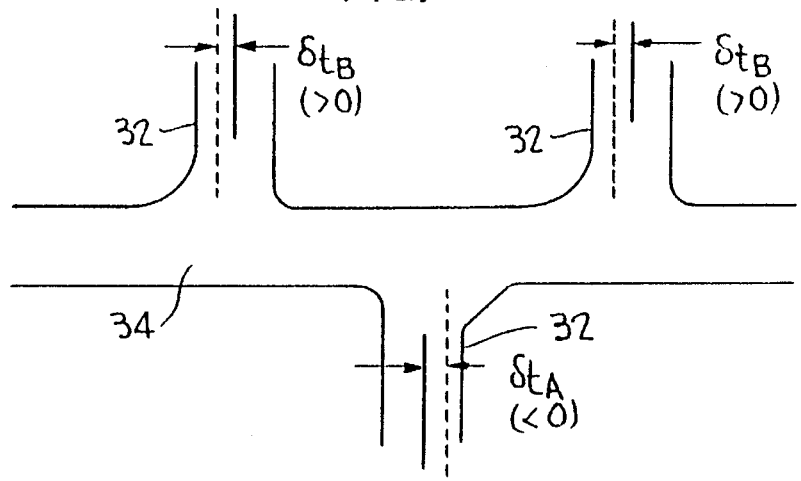
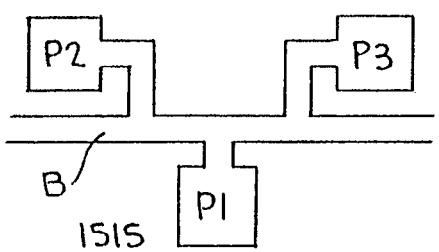
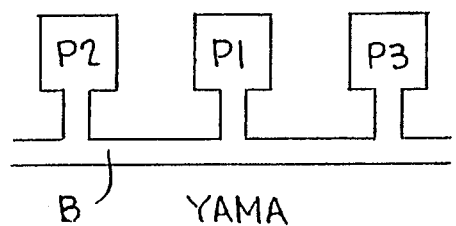
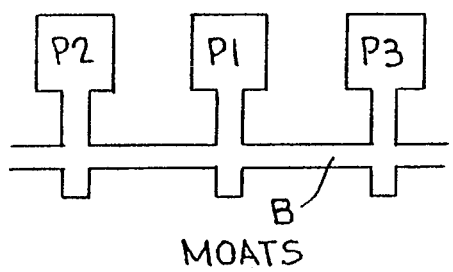
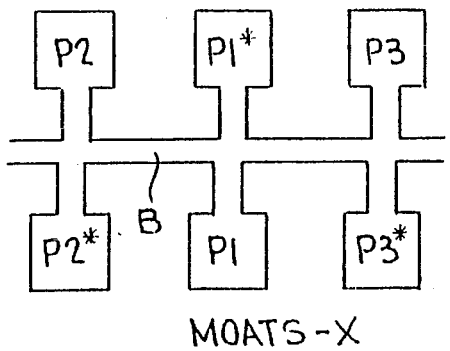

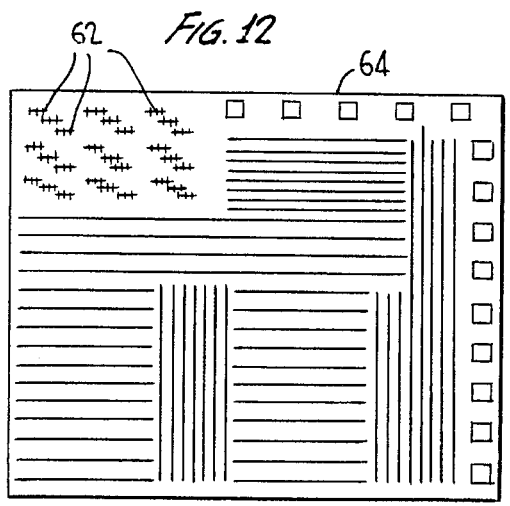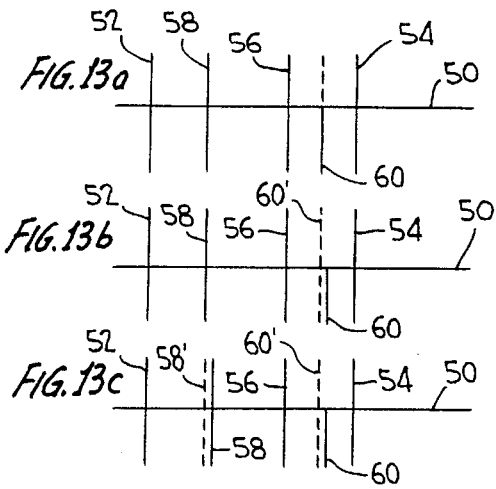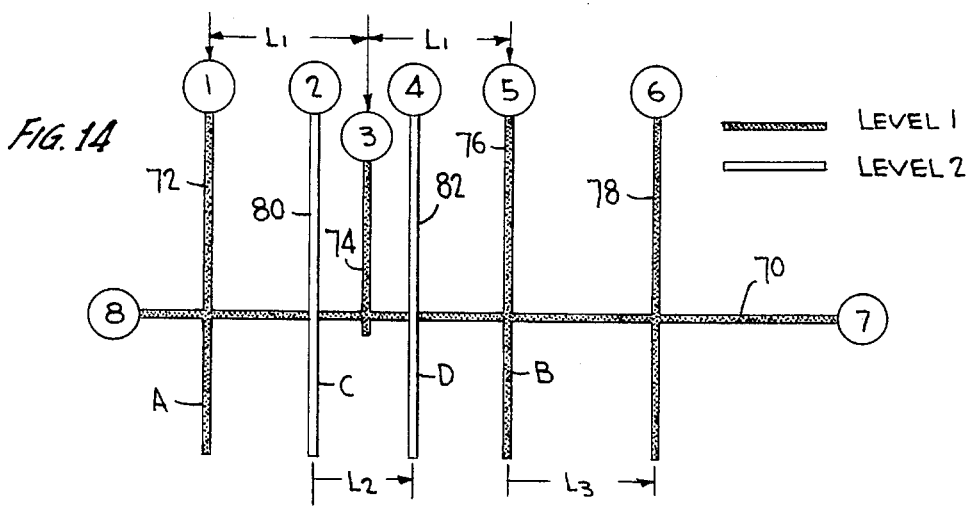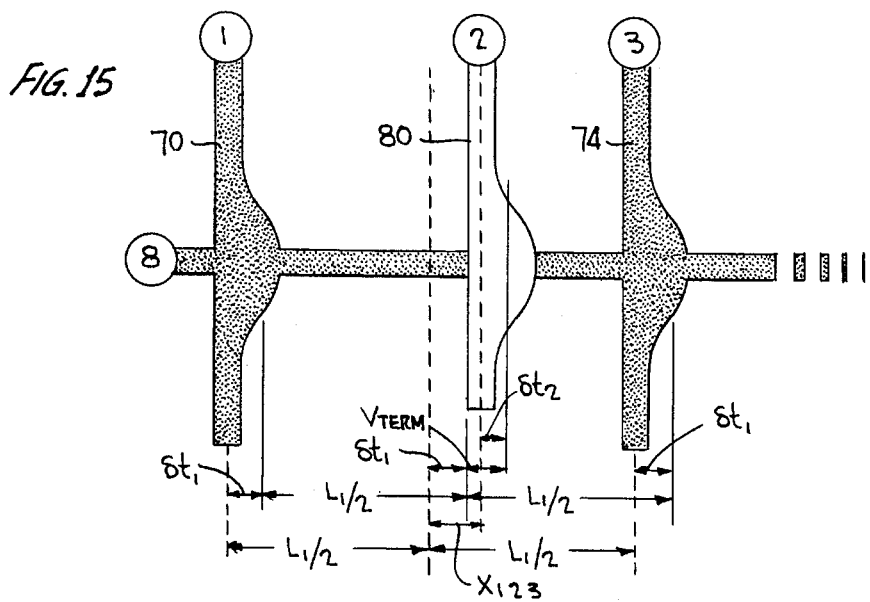

ELECTRICAL TEST STRUCTURE AND METHOD FOR MEASURING THE RELATIVE LOCATIONS OF CONDUCTING FEATURES ON AN INSULATING SUBSTRATE

Cross-Reference to Related Applications

This application is a continuation-in-part of U.S. pat. application Ser. No. 07/852,439, filed Mar. 13, 1992 now U.S. Pat. No. 5,383,136.

FIELD OF THE INVENTION

The present invention is directed to submicrometer feature placement metrology, for verifying patterns used in fabrication of semiconductor integrated circuits and the like. More particularly, the invention is directed to methods and structures for measuring the relative separation of conductive features formed in one or more manufacturing steps, while eliminating effects of systematic imperfections in test structures.

BACKGROUND OF THE INVENTION

As is well known, semiconductor manufacturing processes, as used to manufacture integrated circuits (ICs), involve a succession of fabrication operations requiring accurate registration of the tools used in each operation with the semiconductor wafer being processed. More specifically, successful semiconductor manufacturing requires highly accurate alignment of features on masks used in photolithographic processes, such that overlying successive mask-defined patterns of material are located on the wafer with precision in the low tens of nanometers range. Lithographic tools with such capabilities are being developed, but the metrology to routinely monitor and evaluate the performance of these new tools is lagging. Specifically, electrical test structures—that is, structures formed using the same tools and techniques used to manufacture the product of interest, but designed to have known and readily measurable characteristics, to allow evaluation of the manufacturing process—are needed. See Buehler et al U.S. Pat. Nos. 4,516,071 and 4,918,377, and Thomas U.S. Pat. No. 3,974,443, providing low-cost test structures for evaluating the accuracy of manufacturing steps during the advanced stages of process development and during manufacturing. However, the test structures shown in these documents are inadequate to meet current needs.

There are three principal classes of applications of test structures of interest here. In a first class of application, where the test structure is used for evaluation of accuracy of pattern generation feature placement, the entire test structure is replicated in a single conducting film on the substrate after it is imaged by a steered beam and then developed in an overlying resist film. When, for example, the serial printing of the features of the test structure during fabrication is interrupted by repositioning of the workpiece with respect to the printing equipment, the test structure allows the evaluation of the accuracy of placement of the features printed prior to the interruption with respect to those printed subsequently. The extracted relative placement of local features enables comparison with their specified relative placement. This comparison provides a significant figure of merit for pattern generation tool performance evaluation.

In a second class of applications, where the test structure is used to perform overlay extraction for tool alignment capability evaluation, and for mapping the local overlay i.e., net feature misplacement, or "mismatch" of features on a pair of masks, two different complementary patterns, together constituting the test structure, are exposed with the same tool into the same single resist film prior to development of the composite image and its replication in an underlying conducting film. The test structure enables measurement of any local mismatch in the overlay of the two exposures. If, for example, the two exposures are made using two respective masks, and the contributions to the observed overlay originating in the patterning of the masks are known or are insignificant, then the tool alignment performance may be extracted. Conversely, when the tool-induced contribution to overlay is insignificant or is separately extracted, then the local overlay of the two masks can be measured. When the location of features in the resist by the first mask defines a reference grid, overlay mapping then enables the evaluation of feature placement on the second mask, which may be an x-ray lithography reticle, for example.

A third class of applications, where the test structure is used for mapping the local overlay of two levels in a standard or nonstandard IC wafer fabrication process, involves measurement of the alignment of features on a mask to those on a substrate that is pre-patterned with a conducting film. An important application is measuring the alignment of vias (i.e., holes extending through an insulating layer or the like) with respect to an underlying metal interconnect layer. The process used to fabricate the test structure typically includes at least two separate etch and two separate photolithographic steps. However, the entire test structure may still be replicated in a single conducting film which is patterned twice. See J. J. LaBrie, B. Fay, M. A. Blanco, K. M. Monahan, J. T. Chen, D. F. Kyser, "Characterization of Two Level Overlay in X-Ray/Optical Stepper Mix and Match Lithography", SPIE Vol. 775, *Integrated Circuit Metrology, Inspection, and Process Control* (1987).

The prior art includes numerous electrical test structures useful in one or more of the classes of applications described above. A first type of electrical test structure, termed the "differential linewidth bridge" or "cross-bridge resistor" has been used for measurement of electrical linewidth. See U.S. Pat. Nos. 3,974,443 to Thomas, and 4,516,071 to Buehler, and M.G. Buehler, S. D. Grant, and W. R. Thurber, "Bridge and van der Pauw Sheet Resistors for Characterizing the Linewidths of Conducting Layers", *J. Electrochem. Soc.*, Vol. 125, pp. 650–654 (1978). Using a differential linewidth bridge for overlay measurement enables the extraction and mapping of the local overlay of two patterns from the difference in linewidth of a pair of closely separated, parallel, linear features. The respective features are replicated on the substrate by splitting lengthwise, with a second exposure, a single linear feature defined by a first exposure.

An example of the steps used in forming such a split bridge test structure is shown in FIG. 1. FIG. 1(a) shows a first pattern, e.g., used to form conductive material on a substrate. FIG. 1(b) shows a second similar pattern used similarly. If the two patterns are properly aligned, the pattern of FIG. 1(c) results. To test the relative alignment, currents can be forced between the conductive pads 10 of the lower pattern and 12 of the upper pattern by applying test voltages therebetween. If the two exposures were properly aligned, the conductors 14 and 16 connecting the pads 10 and 12, respectively, will be of equal width, and hence will conduct equal current.

Using this technique, Y. Kuroki, S. Hasegawa, T. Honda, and Y. Iida, "X-ray Exposure Mask Accuracy Evaluation Using Electrical Test Structures", *Proc IEEE International Conference on Microelectronic Test Structures*, Vol. 4, No. 1, 123–127, March 1991 report resolutions of better than 100 nm in overlay metrology in double mask processing. B. Fay and T. Hasan, "Electrical Measurement Techniques for the Characterization of X-Ray Lithography Systems", *Solid State Technology*, pp. 239–243, May 1986 and C. J. Ashton, "Differential Linewidth Structures for Overlay Measurements at 0.25 Micron Ground Rules", SPIE Vol. 775, *Integrated Circuit Metrology, Inspection and Process Control*, p. 201 (1987) demonstrate equally impressive results in a single conducting film.

However, there are limitations on use of this technique. Its use for the first class of applications discussed above is technically cumbersome, and it is process-incompatible with the third class of applications. Of course, it may still be used in multilevel applications where a nonstandard IC fabrication process sequence is acceptable. The differential linewidth bridge technique can also be used to evaluate manufacturing techniques in the second class of applications discussed above, although there the two complementary patterns must be imaged in positive resist.

A second significant limitation of the differential linewidth bridge technique is that the evaluation of the accuracy of placement, that is, the accuracy of the overlay of successive operations, is only as accurate as the linewidth measurement. More specifically, in conductors having smaller dimensions, the distinction between the actual or "physical" linewidth of a tap connected to a principal conductor and its measured or "electrical" linewidth becomes significant. In uniform films, the correspondence between physical and electrical linewidths tends to be very good even into the submicrometer region. It is not necessary to use test structures having submicrometer geometries when measuring comparative linewidths for the purpose of determining overlay. In fact, submicrometer linewidths may actually be deleterious in this application because what is actually extracted in a linewidth bridge measurement is the average electrical linewidth along the length of the bridge. This length is typically at least 100 μm. The relationship of this extracted average to the variation in the actual local linewidth at different points along its length, as a consequence of material and/or processing nonuniformities, is significant. The smaller the area occupied by the test structure, the more sensitive is the extracted measurement to the effective spatial resolution. That is, the accuracy of a measurement of overlay mismatch in, for example, the x-direction, made using the differential linewidth technique, is affected by any mismatch in the y-direction. Further, the effect of mismatches in one dimension on measurements of mismatches in the other dimension increases with the minimum size of the basic structure.

A second well-known test structure used in evaluation of IC manufacturing techniques is the van der Pauw bridge shown in FIGS. 2(a)–(c). As in the case of the differential linewidth bridge of FIGS. 1(a)–(c), FIGS. 2(a) and (b) show two patterns printed in successive operations. If they are aligned correctly, the symmetrical structure of FIG. 2(c) is formed in conductive material. Its symmetry can be determined by forcing currents between various pairs of the pads 20; if uniform current flows between each pair, the two exposures were properly aligned.

Until recently, the van der Pauw resistor alignment bridge shown in FIGS. 2(a)–(c) had been used exclusively in the first and second classes of applications in which the complementary patterns were sequentially imaged in negative resist, that is, at least when the conducting film was patterned by etching. See D. S. Perloff, "A Van der Pauw Resistor Structure for Determining Mask Superposition Errors on Semiconductor Slices", *Solid State Electronics*, Vol. 21, pp 1013–1018 (1978). However, a more recent paper has reported on the extension of its use to a multilevel structure of the third class of application. D. W. Feldbaumer, C. J. Varker, M. Griswold, and B. J. Allen, "Design and Application of the Interlayer van der Pauw Resistor Alignment Bridge", *IEEE Transactions on Semiconductor Manufacturing*, Vol. 3, No. 4, pp. 206–215, Nov. 1990. In all applications, the van der Pauw bridge offers compactness of the active area for pairs of measurements in both coordinate directions. Another advantage is that the multilevel implementation is fully IC process-compatible.

However, the absolute accuracy and precision provided by the van der Pauw bridge are comparable to that provided by other techniques only when applied to films of relatively high sheet resistivity $\rho_s$. In particular, in-depth analyses provided by Perloff, supra, suggest that $\rho_s$ greater than 100 Ω/sq may be necessary to reduce measurement uncertainties to below about 20 nm, or example. Both sensitivity (mV/μm) and accuracy degrade as $\rho_s$ decreases. Accordingly, the application of this structure to the low sheet resistivity films used for interconnect metal could be quite difficult.

FIG. 3 reviews the salient features of the basic architecture of a third principal type of known test structure, the voltage-dividing potentiometer disclosed in D. R. Thomas and Richard D. Presson, "An Electrical Photolithographic Alignment Monitor", *Digest of Papers, Government Microcircuit Applications Conference*, pp. 196–197 (1974) and T. J. Russell, T. F. Leedy, and R. L. Mattis, "A Comparison of Electrical and Visual Test Structures For Evaluating Photomask Alignment in Integrated Circuit Manufacturing", *Technical Digest IEDM*, Washington, D.C., pp 1–3, Dec. 5–7, 1977. Such a potentiometer provides a measurement of the displacement of a central "tap" or probe P1 between two end taps P2 and P3. If P1 is formed in a separate operation than that used to form P2 and P3, the potentiometer provides an indication of the accuracy of the alignment of the operations.

The basic test structure architecture shown in FIG. 3 is referred to herein as the "classical" voltage-dividing potentiometer. The Thomas et al and Russell et al papers, supra, describe the performance of such potentiometer-based test structures. In both cases, the reported measurement uncertainties were approximately 100 nm.

The classical voltage dividing potentiometer provided by FIG. 3 is used by forcing a current to flow between the ends of a "bridge conductor" 22, and measuring the voltage drops $V_1$ and $V_2$ between pairs of taps 24 and 26, and 24 and 28, respectively. Comparison of $V_1$ and $V_2$ indicates the relative resistance of the corresponding portions of the segment of bridge 22 between taps 26 and 28 and hence of their relative length. The "offset" x of the probe P1 as it "slides" along the bridge conductor 22, relative to the midpoint between probes P2 and P3, is determined from the relationship between the voltage drops $V_1$ and $V_2$, and the distances x and L, as a test current is forced through the bridge, according to:

$$x = \left( \frac{V_1 - V_2}{V_1 + V_2} \right) \left( \frac{L}{2} \right) \tag{1}$$

When the structure is implemented on IC wafers (for example), the probe P1 is referred to as the "center" tap 24, and the probes P2 and P3 are referred to as "end" taps 26 and 28. The center-to-center spacing of taps 26 and 28, L, serves as the "ruler" for the measurement of x, the "offset" of the probe P1 from the midpoint of probes P2 and P3.

The voltage-dividing potentiometer, including the enhanced version according to the invention that is described below, is readily implemented for the first, second and third classes of applications.

In order that measurements made using a voltage dividing potentiometer and analyzed according to Eq. (1) can provide a correct measurement for the offset x, that is, in order to evaluate correctly the accuracy of registration of successive manufacturing operations (for example), the taps must be electrically connected to the bridge at point contacts. If the taps are not thus connected to the bridge by point contacts, systematic errors in the extracted value of x will result from an effective shortening of the electrical bridge length due to the finite width of the contact regions connecting the taps to the bridge. The bridge can be made sufficiently long that the tap contacts are essentially point contacts relative to the bridge's length. In this limiting case, the quantity L may be approximated by Eq. (1) as the design value of the center-to-center separations of the end taps. However, when this approach is taken, random errors resulting from the extended length of the bridge, combined with micro-scale variations of the test structure composition and geometry and voltage measurement noise, limit the classical voltage-dividing potentiometer to about 0.1 μm resolution. Further, in many circumstances it is impractical to significantly extend the bridge conductor 22 to provide a large value for L.

Since the filing of parent application Ser. No. 07/853,439, it has been realized that errors from a number of different sources may arise during microcircuit fabrication, all resulting in improper evaluation of conductor lengths of conducting segments when determined by voltage drops across them. It would be desirable to provide a test structure whereby these various sources of error in conductor length measurements might be distinguished from one another.

For example, the art is generally aware of systematic patterning errors referred to collectively as "overlay." The "overlay" 0 is a vector quantity defined at every location on the substrate as the difference between the vector position $P_1$ of (for example) a first portion of a conductive structure on a substrate with respect to an arbitrary reference point, and the vector position of the corresponding point $P_2$ in an overlaying pattern, e.g., a second portion of the conductive structure. The overlay 0 is zero when $P_1=P_2$, i.e., when the composite pattern is formed correctly. For example, patterning overlay errors result when the features formed on a substrate in a second image-transfer operation are not properly located relative to features having been formed thereon in a prior operation, in which case the "overlay" has a nonzero value; nonzero overlay may also result when a feature is improperly located with respect to other features formed in the same imaging operation. Thus, nonzero "overlay" (as the term is used by the art) may derive from the misalignment of images formed sequentially by the image-transfer tooling, e.g., when two or more masks are used in sequential photolithography operations to form a resulting composite pattern on the substrate. Nonzero "overlay" may also result from errors or defects in one or more of the masks, e.g., improper placement of features on the masks.

In the parent application, a quantity "x" referred to as the "offset" was defined to be the displacement of the center tap of a potentiometer formed on a substrate in a second image-transfer operation from the midpoint between the two end taps of the potentiometer formed thereon in a prior image-transfer operation. When the displacement x was zero, the composite pattern was defined to have zero overlay. Thus the displacement x measured using the potentiometer in many cases corresponded to the overlay 0 of the overlaying patterns forming the composite pattern, that is, when the overlay 0 was due entirely to an error measured by the offset x. While for such potentiometers the offset x of an individual potentiometer may or may not be defined to be the same as the overlay 0 of the composite pattern, the difference between the values of x and 0 will be constant in foreseeable applications. For example, when the composite pattern includes two or more potentiometers formed in the same image-transfer operations, they may exhibit different displacements $x_1$ and $x_2$, but the overlay of the composite pattern will be the same.

Microcircuit fabrication processes used to form individual or composite patterns are also susceptible to random errors caused by patterning microdefects. These may affect the reliability of overlay measurements derived from estimates of the quantity x defined previously.

The inventors have also found that corners intended to be square where conductive features meet on a substrate tend to be rounded at their inside corners, contributing further errors in measurement of respective conductor lengths.

It would be highly desirable to provide a test structure from which overlay could be extracted electrically in a manner which minimized the effects of patterning microdefects through redundancy afforded by the formation of multiple potentiometers located at a single site, separated the overlay measurements into contributions deriving from feature misplacement on the masks and from misalignment of portions of composite images formed using more than one mask, and provided integral facilities for estimation of overlay introduced by imaging tools. One purpose of the last-mentioned facility would be to enable cross-referencing electrical and imaging-tool measurements of the overlay embedded in a single composite pattern.

Identification of the various sources of errors in conductor length measurements would also be useful for improvement of process quality and increasing yields of manufacturing processes.

OBJECTS OF THE INVENTION

Therefore, it is a principal object of the present invention to provide a metrology tool that provides measurement of feature placement to within 10 nanometers employing conventional fabrication techniques and test equipment.

Another object of the present invention is to provide a test structure useful in evaluating multilevel registration applications.

Yet another object of the present invention is to provide an improved process and test structure for extracting the separation of parallel features at the 10 nm level, and specifically to provide means for eliminating substrate-dependent systematic errors in an electrical test structure.

It is a further object of the invention to provide a test structure and method whereby errors in conductor length measurements resulting from tool alignment mismatches, tool manufacturing errors, contamination, and inside corner rounding can be separately analyzed, for improvement of processing steps and identifying sources of inadequate yield.

It is a further object of the invention to provide a method for measurement of lengths of conductive features on a substrate suitable for correlation with measurements made using other techniques, e.g., optical microscopic or interferometric techniques, and for thereby calibrating such other types of instruments.

SUMMARY OF THE INVENTION

A first aspect of the present invention involves a modified sliding wire potentiometer, again featuring a center tap extending from a conductive bridge between end taps extending from the bridge. A number of dummy taps, that is, taps not employed for voltage measurement in a particular measurement sequence, are also provided in an adjoining segment of the bridge, to allow the measurement of the conductor-shortcoming effect caused by finite tap width, and thus enabling appropriate compensation therefor. This structure permits measurement of the lateral placement of the center tap relative to the end taps with residual errors typically less than 15 nanometers.

It was further discovered by the inventors that certain systematic errors characteristic of the substrate on which the test structures are replicated could be attributed to imperfections at the inside corners of the intersections of the voltage taps with the bridge.

Therefore, according to a further aspect of the invention, the taps of the sliding-wire potentiometer all extend from the same side of the bridge. Systematic errors resulting from "insidecorner rounding" where the taps meet the bridge are substantially eliminated by this improvement. The result is a feature placement metrology tool that provides measurement of feature placement to within 10 nanometers, eliminating the systematic errors discussed above, and which can be implemented using conventional fabrication techniques and test equipment.

More specifically, the test structure according to the invention comprises a bridge conductor divided into three segments by pairs of voltage taps. A first segment has no intermediate taps; a second segment has a number of dummy taps intermediate its ends; and a third segment has an additional single central tap, which may be formed in a different operation than the remainder of the test structure, intermediate its ends. Preferably, the central tap extends from the same side of the bridge conductor as the taps at the ends of the third segment thereof. In order to evaluate a manufacturing operation, for example, to monitor any offset caused by inaccuracy of registration of a tool used in a subsequent step with respect to conductive features formed in prior steps, or to evaluate the accuracy of the tools themselves, a current is forced along the bridge conductor. The voltage drops across the three segments are measured. Comparison of the voltage drops across the first and second segments allows evaluation of the segment shortening effect of the taps; comparison of the voltage drops across the two portions of the third segment defined by the location of the central tap allows evaluation of their length, and thus of the accuracy of registration of the step used to form the central tap.

According to the invention of the present continuation-in-part application, it has been realized that "tool-wide" errors, such as errors resulting from misalignment of photolithographic "masks" used in successive operations, and "local" errors, such as misplacement of a feature within a mask, which together contribute to the overlay measured, can be separately identified if a set of offset measurements are made of a test structure comprising a number of individual test structures. According to this aspect of the invention, a number of test structures of essentially identical configuration are formed on a single substrate, in a process wherein different portions of the test structure are applied at different manufacturing steps. Analysis of offsets measured with respect to each of the test structures can be carried out to differentiate, for example, the contributions of mask misalignment errors and mask patterning errors to the total overlay, while random variations in conductor segment length measurements due to contamination or the like are effectively removed from the results. If the test structures are properly designed, according to other aspects of the invention, inside corner rounding can be effectively eliminated as a source of erroneous length measurements.

BRIEF DESCRIPTION OF THE DRAWINGS

Other objects and advantages of the invention will become apparent upon reading the following detailed description and upon reference to the drawings, in which:

FIGS. 5(a) and (b) provide diagrammatic illustration of examples of flipwise symmetrical and unsymmetrical uneven inside corner rounding (ICR);

FIG. 6 is a diagrammatic illustration of the terminology used in explaining the invention;

FIGS. 9(a)–(d) provide diagrammatic partial illustrations of four embodiments of test structure architectures according to the invention;

FIG. 12 shows the layout of a typical semiconductor wafer including plural test structures according to the invention;

FIGS. 13(a)–(c) illustrate the manner in which a typical test structure may be distorted differently depending on the source of error;

FIG. 14 illustrates a test structure useful for plural measurements of offset, with plural measurements of the segment-shortening effect occasioned by the presence of taps; and FIG. 15 is an enlarged view of a portion of the test structure of FIG. 14.

DESCRIPTION OF THE PREFERRED EMBODIMENT

According to one aspect of the invention, uncertainty in the measurement of the respective effective equivalent lengths of bridge conductor segments on either side of a central tap due to the finite width of taps connected to the bridge conductor is reduced; according to a second aspect of the invention, systematic errors that originate in certain common design practices are simultaneously eliminated. The first of these benefits is obtained by measuring the line-shortening effect $\delta L$ due to a single tap and using $\delta L$ to correct the physical center-to-center separation of the end taps L, thus determining the effective equivalent value of bridge length, for use in Eq. (1). Other measurements are then accordingly corrected. The bridge length L then no longer needs to be very long compared to the tap width, but can be made short enough to minimize random linewidth errors, and increase the sensitivity of the measurements made. The second benefit is obtained by proper arrangement of the taps used to connect the test signals to the bridge conductor.

Figure 1A:
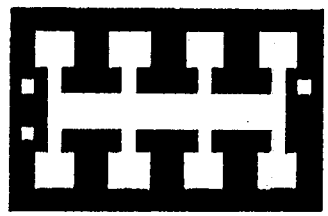
FIGS. 1(a)–(c) diagrammatically illustrate prior art techniques of differential linewidth bridge measurement.
Figure 2A:
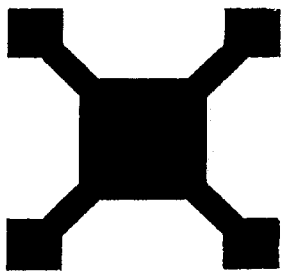
FIGS. 2(a)–(c) diagrammatically illustrate a prior art van der Pauw resistor alignment bridge.
Figure 1B:
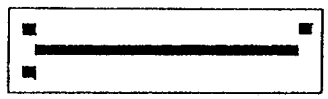
Figure 2B:
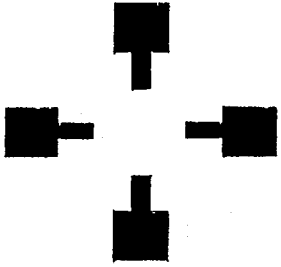
Figure 1C:
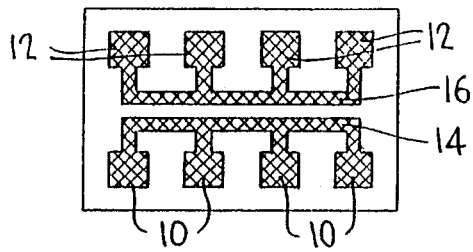
Figure 2C:
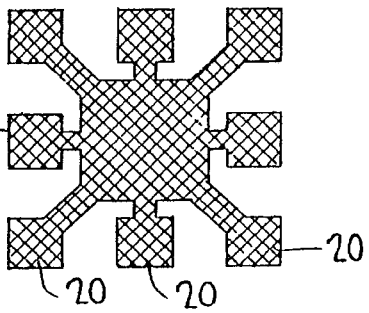
Figure 3:
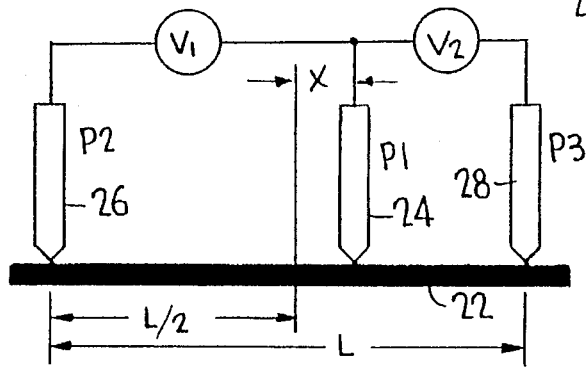
FIG. 3 is a diagrammatic illustration of a prior art voltage-dividing potentiometer.

After the line-shortening effect δL has been determined, the length L of the conductor segment can be corrected, such that the value of the offset x in FIG. 3 is given by $$x = \left(\frac{V_1 - V_2}{V_1 + V_2}\right)\left(\frac{L - 2\delta L}{2}\right) \quad (2)$$

Accurate determination of the offset x allows evaluation of the accuracy of manufacturing operations, in accordance with the objects of the invention.

Figure 4:
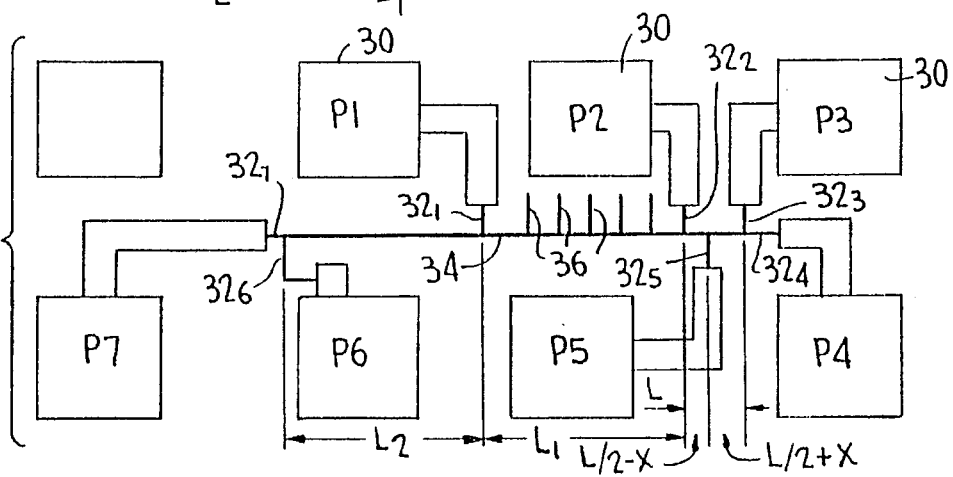
FIG. 4 is a diagrammatic illustration of a first embodiment of test structure according to the invention.

FIG. 4 shows a test structure allowing determination of δL according to a first aspect of the invention. The enhanced voltage dividing potentiometer test structure shown in FIG. 4 includes a number of pads 30, numbered $P_1$-$P_7$, and connected by conductive taps $32_1$-$32_7$ to a bridge conductor 34. In a typical use of the test structure of FIG. 4, the bridge conductor 34, pads $P_1$-$P_4$, $P_6$, and $P_7$ and their associated taps $32_{1-4}$, $32_6$, and $32_7$ are formed in a first operation, while pad $P_5$ and tap $32_5$ are formed subsequently.

The goal of the test structure is to allow objective determination whether tap $32_5$ is properly registered with respect to the taps formed earlier. This can be determined by measuring the respective distances along the bridge conductor between the intersection of the taps $32_4$ and $32_6$, and the intermediate tap $32_5$. That is, if the tap $32_5$ is centered between taps $32_4$ and $32_6$, it can be concluded that the two fabrication steps were, in fact, carried out in proper registration.

Distances are measured as in the prior art, that is, by forcing a current between pads $P_4$ and $P_7$ connected to respective ends of the bridge conductor 34. Voltage drops measured between pads connected to taps delimiting various segments of the bridge conductor 34 are indicative of the lengths of the segments. This use of the structure of FIG. 4 is identical to the practice of the prior art, e.g., using the structure of FIG. 3. However, as noted above, the prior art length measurements are distorted by a "line-shortening" effect caused by the finite widths of the taps; in effect, the taps reduce the local resistance of the bridge conductor, distorting measurements of its length carried out by measuring its response to test currents forced along the bridge.

According to an important aspect of the invention, the distortion in the voltage measurements caused by the finite width of taps 32 can be compensated for by adding a number of "dummy taps" 36 and measuring the effect of these on the measured length of the conductor 34. More specifically, the current-carrying ability of the conductor is distorted by the dummy taps 36 in a manner analogous to the effects of the taps 32 on the conductivity of the conductor 34. The structure of FIG. 4 allows the calculation of a length-shortening factor δL, using the following equation:

$$\delta L = \frac{L_1 V_{P1-P6} - L_2 V_{P2-P1}}{((n+1)V_{P2-P1}) - V_{P1-P6}} \quad (3)$$

where n is the number of "dummy" taps between taps $32_1$ and $32_2$, $L_1$ is the design length between taps $32_1$ and $32_2$, $L_2$ is the design length between taps $32_1$ and $32_6$, and $V_{P1-P6}$ and $V_{P2-P1}$ are the voltages measured between the corresponding pads responsive to a given test current forced between the pads $P_4$ and $P_7$.

Therefore, according to one significant aspect of the invention, the fact that the taps are of finite width can be compensated for in determining the offset x by incorporating dummy taps into the design and determining δL using the equations above, that is, by comparing the voltage drops measured across first and second segments of the bridge conductor, formed with and without dummy taps, respectively. It can thus be seen that the FIG. 4 structure according to the invention provides very significant and useful results.

The inventors' experimentation with the structure of FIG. 4 indicated that while random residual errors tended to be present in the measurements of the relative offsets from a particular substrate, typically 5–15 nm, a superposed systematic error of up to 100 nm that was constant for a particular substrate but varied from one substrate to another was also noted. The latter is referred to as the Substrate Dependent Systematic Error (SDSE), and is not to be confused with the systematic error resulting from low ratios of bridge length to voltage tap contact width, which is successfully addressed by the modified potentiometer architecture according to the invention, which is presented in FIG. 4.

By comparison, SDSE is now known to depend on the preparation of the substrate and is only present to the extent that aspects of the pattern as produced do not exactly conform to the structure as designed.

The inventors have formed a model for the origin of SDSE, simulated the effects it produces, and have found the results of the simulations to match observations and measurements. Accordingly, the invention includes further improvements on the modified voltage-dividing potentiometer presented in FIG. 4, eliminating SDSE.

Figure 7:
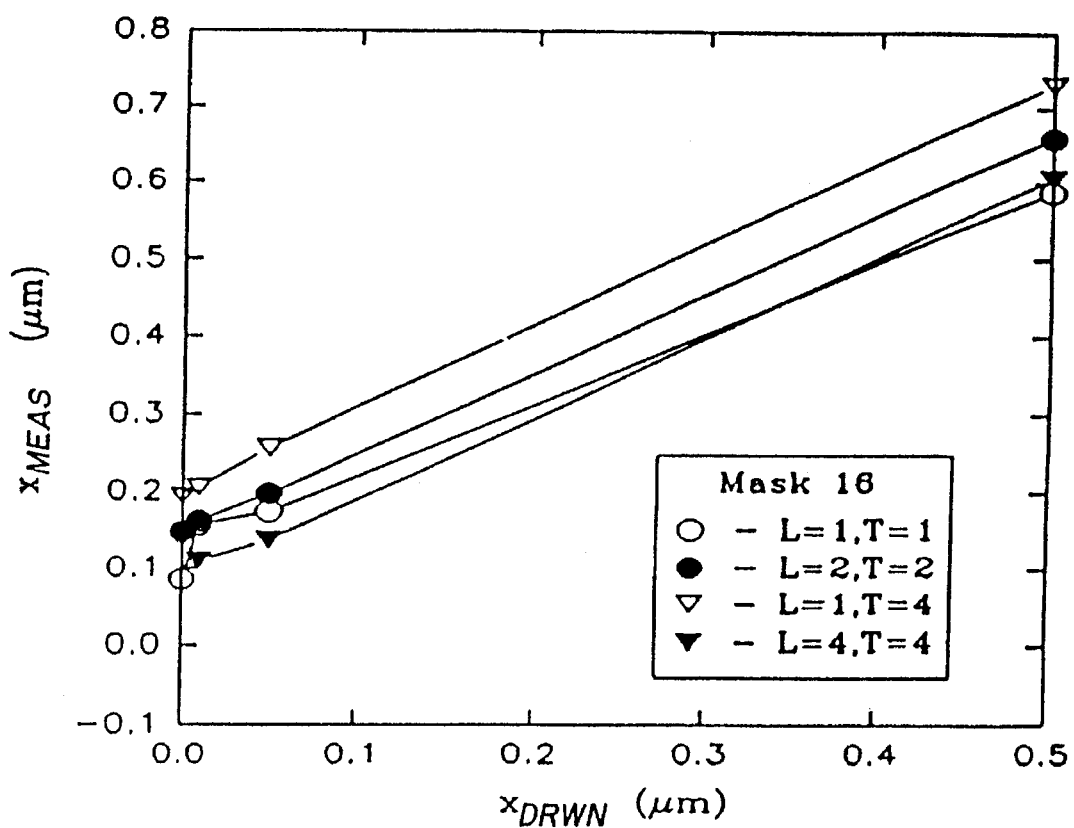
FIG. 7 is a graph showing data determined in testing the structure of FIG. 4.
Figure 8:
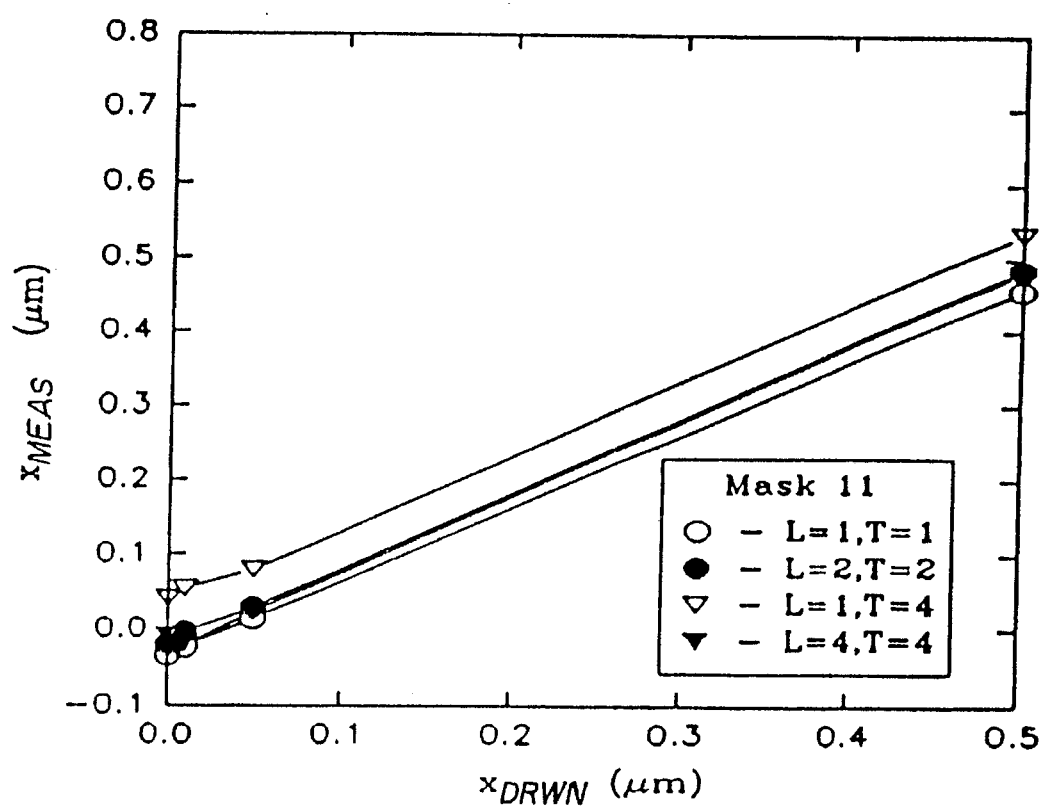
FIG. 8 is a graph comparable to FIG. 7 of data from a second similar test.

FIGS. 7 and 8 show data obtained by measurements carried out on two test structures corresponding to that shown in FIG. 4. FIGS. 7 and 8 graph a number of measured offsets "$X_{MEAS}$" (the departure of a tap $32_5$ in FIG. 4 from the nominal or design location centered between taps $32_4$ and $32_6$) versus a variety of designed-in values for the offset ("$X_{DRWN}$") to determine whether the test structure of FIG. 4 did in fact allow accurate determination of x. As can be seen from examination of FIGS. 7 and 8, while $X_{MEAS}$ generally varies linearly with $X_{DRWN}$, the two structures exhibited markedly different errors.

The structures from which the measurements shown in FIGS. 7 and 8 were extracted were fabricated on a single layer, and in a single pass, by a state-of-the-art electron beam primary pattern generator operating essentially accordingly to the first class of applications identified above. Therefore, actual misplacements of the center taps between the end taps of the magnitudes observed was considered highly unlikely. It was hypothesized, and subsequently confirmed by the inventors, that small variations in the magnitude and orientations of Inside Corner Rounding (ICR) occurring where the taps meet the bridge accounted for the observed effects. Specifically, the test results suggested the hypothesis that the inside corners were characterized by uneven ICR, translational symmetry, and flip-wise asymmetry. FIGS. 5(a) and (b) (discussed below) show examples of these systematic defects, while FIG. 6 illustrates parametric representations used to develop mathematical models thereof.

More specifically, a test chip containing a number of test structures based on the modified voltage-dividing potentiometer shown in FIG. 4 was designed and printed on a master chrome plate at 10× by a MEBES-76 electron beam system with 0.1 μm by 0.1 μm pixel size. The master was then stepped across working masks at 10× reduction and 10 -mm stepping distances with an optical tool, providing a series of designed-in or "drawn" offsets, $X_{DRWN}$, of 0, 10, 50 and 500 nm in a selection of test structures in each of a 10 by 10 array of chips. Two different test structures were then fabricated using this test chip, and were installed on a dc parametric tester for measurement extraction. The first test structure mask ("Mask 16") was of antireflective chrome, and the second ( "Mask 11") of bright chrome.

FIGS. 7 and 8 are plots of $X_{MEAS}$, calculated using Eq. (4) and averaged over four mask sites, versus $X_{DRWN}$, for masks 16 and 11, respectively. Partial validation of the electrical length shortening effect of attached voltage taps, represented by Eq. (3), is illustrated; that is, the results shown in FIGS. 7 and 8 indicate that as $X_{DRWN}$ and $X_{MEAS}$ are linearly related, $\delta L$ is in fact consistent for a given device. More specifically, the slope of each of the lines is very close to unity, indicating that the measured offset $X_{MEAS}$ scales almost exactly linearly with the design offset $X_{DRWN}$.

Significant nonzero y-axis intercept values in FIGS. 7 and 8 remain to be explained. For Mask 16, as shown in FIG. 7, the intercepts are in the range of 0.1 to 0.2 m, while for Mask 11, as shown in FIG. 8, the y-intercepts are clustered around the origin. It has been discovered by the inventors that the observed intercepts are in fact substrate-dependent systematic errors (SDSE), i.e., errors in the apparent location of the offset of the center tap relative to the end taps, caused by a subtle flaw of the pattern replication process.

It was hypothesized by the inventors that the nonzero y-intercepts of the data graphed in FIGS. 7 (in particular) and 8 were due to the effects of inside corner rounding of the tap-to-bridge intersections introduced in the working mask replication process. There are two effects that inside corner rounding could have on the extracted measurement of x which would cause an apparent misplacement of the center tap consistent with the observed SDSE effects. The first occurs when the taps attached to opposite sides of the bridge are of different electrical widths at their intersections with the bridge. In this case a single value of $\delta L$, extracted from taps on one side of the bridge only, does not adequately describe the bridge length shortening effect. The second occurs if the tap-to-bridge inside corners are rounded so as to displace the effective electrical centers of the taps in an asymmetrical manner, for example, to displace the electrical centers of the taps on different sides of the bridge in different directions, or nonuniformly in the same direction. The net effect is to move the electrical center of the center tap relative to the electrical centers of the end taps. It should be emphasized that inside corner rounding per se does not render sliding wire potentiometer metrological techniques unworkable; when these effects are understood, they can be compensated for in the initial design.

A high-powered optical microscope was used to examine the extent of visible inside corner rounding, and indicated that while ICR typically varied with the corner's orientation, the ICR detected at particular tap-to-bridge intersections on the same side of the bridge and the same side of the tap appeared to be the same. That is, translationally equivalent corners had the same magnitude of corner rounding, but the corner rounding at each orientation was typically different from that at any other orientation. FIG. 5(b) gives an example of typical corner rounding found on Mask 16. Note that the ICR differed on opposite sides of the bridge conductor—that is, the ICR was flip-wise asymmetrical. Eq. (2) does not provide correct results in this case. As to Mask 11, although there was prominent ICR (as illustrated in FIG. 5(b), the ICR in this case was flipwise symmetrical, such that Eq. (2) is accurate. The comparatively increased asymmetry of the Mask 16 pattern shown in FIG. 5(b) is understood to explain qualitatively the greater value for the y-intercepts observed in the data graphed in FIGS. 7 as compared to the Mask 11 data graphed in FIG. 8.

FIG. 6 illustrates the terminology used by the inventors in parameterization of the inside corner rounding effect in order to quantify the same. As can be seen in FIG. 6, when the magnitude of inside corner rounding is different on opposite inside corners of the same tap-to-bridge intersection, for example on lower side A of the bridge 34, the effective electrical center of the intersection, i.e., the "center line" of current flowing along the bridge (shown by a dotted line), is displaced laterally from the geometrical center line of the tap (shown by a solid line) by a distance $\delta t_A$. A similar effect in the opposite direction is exhibited on the upper side B of the conductor, parameterized as $\delta t_B$. The presence of the tap results in an effective shortening of the bridge length L by amounts $\delta L_A$ and $\delta L_B$. Of course, the metrological objective is accurate measurement of the center-to-center separation of the extended tap line geometries, rather than that of their effective electrical centers at their respective intersections with the bridge. As long as each of any pair of taps has equal $\delta t$ values, the lateral separation of the electrical centers of their intersections with the bridge is equal to the geometrical center-to-center separation of their extended lengths. This condition is expected to prevail in general as a consequence of the local translational symmetry of the feature replication process (e.g., as in FIG. 5(a)) thus rendering Eq. (2) valid. On the other hand, if each of a pair of taps have different inside corner rounding, they will have different electrical displacement values. For example, the taps on the A side of the bridge of FIG. 6 will exhibit electrical displacement with respect to the taps on the B side of the bridge; the electrical separation of the intersections will generally be different from their corresponding geometrical spacing by, in this case, the amount $\delta t_A - \delta t_B$.

However, as noted above, inside corner rounding is only one of two contributors to the systematic error to which the (nonenhanced) modified design in FIG. 4 is vulnerable. In addition to correcting appropriately for this source of error, respective measures of the bridge-shortening parameters $\delta L$ must also be extracted from dummy taps on respective sides of the bridge and used appropriately in the calculation of x.

In summary, Eq. (2) does not give a correct value for $X_{MEAS}$ unless both $\delta t_A = \delta t_B$ and $\delta L_A = \delta L_B$. When $\delta t_A \neq \delta t_B$ or $\delta L_A \neq \delta L_B$, differential displacement and differential bridge-length shortening, respectively, will exist. The offset x is then correctly given by $$X_{MEAS} = \left( \frac{V_1 - V_2}{V_1 + V_2} \right) \left( \frac{L - (\delta L_A + \delta L_B)}{2} \right) + (\delta t_A - \delta t_B) \quad (4)$$

If respective differential quantities $\Delta t$ and $\Delta L$ are defined such that $\Delta t = \delta t_A - \delta t_B$ and $\Delta L = \delta L_A - \delta L_B$, and if $\delta L$ is used to denote $\delta L_A$, then Eq. (4) becomes $$X_{MEAS} = \left( \frac{V_1 - V_2}{V_1 + V_2} \right) \left( \frac{L - 2\delta L}{2} \right) - \\ \Delta t + \left( \frac{V_1 - V_2}{V_1 + V_2} \right) \left( \frac{\Delta L}{2} \right) \quad (5)$$

A comparison of Eq. (5) with Eq. (2) shows that Eq. (2) is a special case of Eq. (5), i.e., where both the differential displacement $\Delta t$ and the differential line shortening $\Delta L$ are zero. Further, Eq. (5) shows that if Eq. (2) is used where $\Delta t$ and $\Delta L$ are not zero, then a plot of $X_{MEAS}$ versus $X_{DRWN}$, where $X_{DRWN}$ is the corresponding actual value of x, will have a slope of unity, but an intercept, $x_o$ of $$x_o = \Delta t - \left( \frac{V_1 - V_2}{V_1 + V_2} \right) \left( \frac{\Delta L}{2} \right) \quad (6)$$

as illustrated in FIGS. 7 and 8.

The quantity $x_o$ given by Eq. (6) is, in fact, the previously described systematic error, SDSE.

The present invention includes an enhancement to the modified design shown in FIG. 4 that also eliminates SDSE. This enhancement is based on the further realization that SDSE is inherent in certain design rules, i.e., in certain common test structure configurations.

FIG. 9 shows three potentiometer-based test structure configurations that obviate the systematic error quantified in Eq. (5), together with a fourth structure, shown for comparison, which does not. For convenience, the respective configurations are referred to as the ISIS (FIG. 9(a)), YAMA (FIG. 9(b)), MOATS (FIG. 9(c)), and MOATS-X (FIG. 9(d)) designs. Each is to be understood to be disposed at the end of a longer bridge, having a number of dummy taps and two further current pads; i.e., the ISIS structure is an exemplary portion of the entire test structure in FIG. 4. Therefore, these four test structures were compared to determine their relative efficacy as metrological elements for evaluating a series of processing steps, i.e., how accurately a central conductor P1 was placed with respect to two outer conductors, P2 and P3.

The asterisks in the MOATS-X drawing in FIG. 9(d) indicate that, by using a set of three pads comprised either of pads P1, P2, and P3 or of pads P1*, P2*, and P3*, one may optionally perform a measurement equivalent to a measurement performed using the ISIS structure of FIG. 9(a) (described and referred to as ISIS. below).

Figure 10:
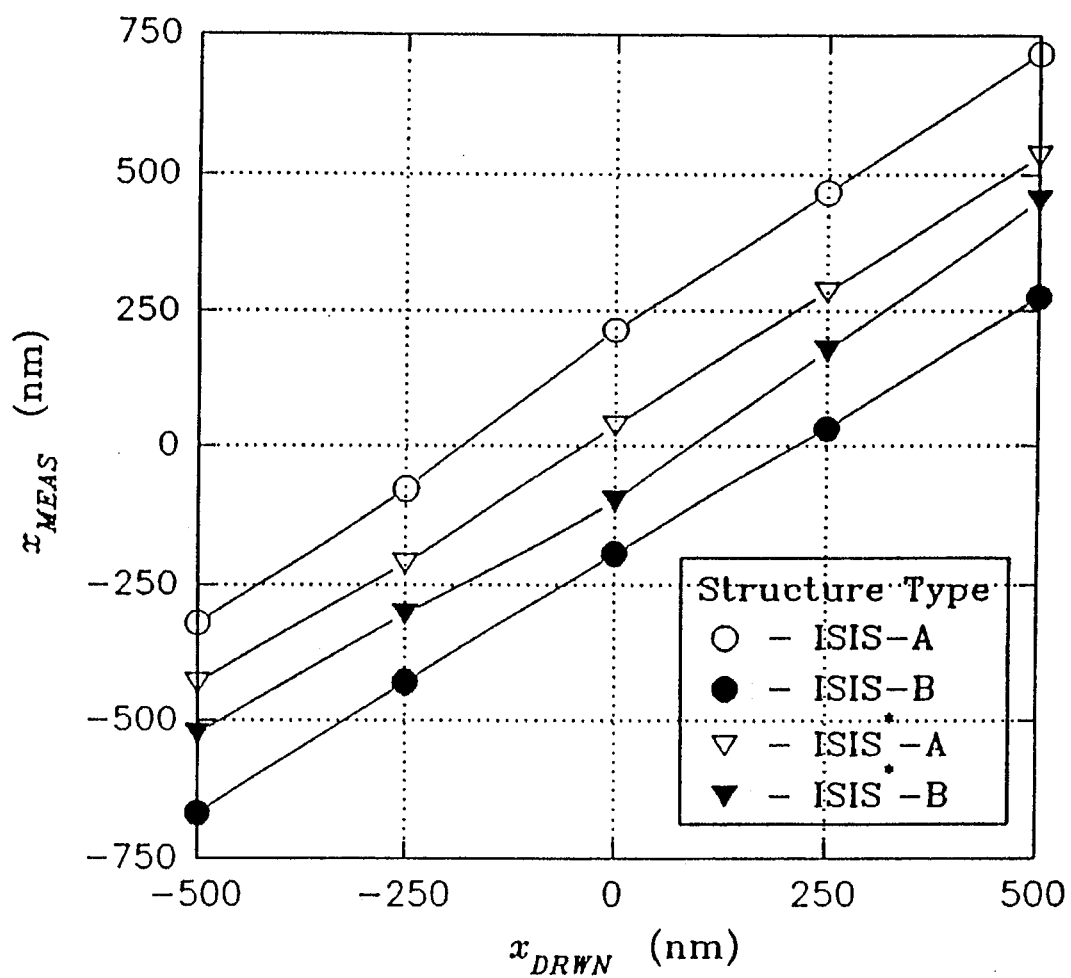
FIG. 10 is a graph comparable to FIG. 7, showing data determined in testing the structure of FIGS. 9(a) and 9(d)

As shown by data reproduced in FIGS. 10 and 11 and discussed below, the ISIS test structure (FIG. 9(a)) comprises essentially the configuration including pads $P_2$, $P_3$ and $P_5$ of FIG. 4, and is subject to the systematic errors (SDSE) discussed above, while the YAMA structure of FIG. 9(b) is not subject to SDSE. Essentially, the distinction between the ISIS and YAMA structures is that the center tap P1 of the ISIS structure is on the opposite side of the bridge B as the end taps $P_2$ and $P_3$, while in the YAMA structure all three taps are on the same side. The surprising result of this difference is that in the YAMA design the differential quantities $\Delta t = \delta t_A - \delta t_B$ and $\Delta L = \delta L_A - \delta L_B$ are generally zero, and thus x may be extracted directly from Eq. (2).

The MOATS design is in this respect identical to the YAMA design. The difference between the MOATS and the YAMA designs is the presence in the MOATS design of tap stubs projecting across the bridge B from the voltage taps P1–P3. For applications of the first and second classes, the YAMA and MOATS structures would give essentially the same results. However, for some of the applications of the third class, the MOATS structure is advantageous in terms of manufacturability.

The MOATS-X structure (FIG. 9(d)), is a double-tapped MOATS that, firstly, enables testing of hypotheses relating to an improvement of the ISIS performance, predicted by modeling, when cross-over tap stubs are used; that is, eliminating the effect of nonzero $\Delta L = \delta L_A - \delta L_B$ by sampling the MOATS-X in the ISIS* mode (end taps on one side and the center tap on the other) as indicated by asterisks in FIG. 9(d). Secondly, the MOATS-X structure allows measurement of the "noise floor" of the primary pattern generation tool by measuring "exactly" the same offset with MOATS structures extending from opposite sides of a single line. In this context, "noise floor" refers to the uncertainty in the placement of a tap due to noise in the primary pattern generator. While some of this effect is expected to average out, there will be a limit to the perfection of replication of an inside corner.

A composite test structure was designed to facilitate as definitive as possible a comparison of the four test chip configurations. Each composite structure contained two ISIS, two YAMA, and two MOATS configurations, and one MOATS-X configuration. In the ISIS, YAMA, and MOATS configurations, one of each pair of structures was measured from the "A" side of the bridge, while the other was measured from the "B" side. Bridge segments both with and without dummy voltage taps were provided to allow measurement of the bridge electrical length shortening parameters $\delta L$.

For T-junction taps, characteristic of the ISIS and YAMA configurations, the key parameters measured are: $\delta L_A$, the bridge electrical length shortening caused by a tap extending from the "A" side of the bridge, and $\delta L_B$, the bridge electrical length shortening caused by a tap extending from the "B" side of the bridge. For the cross-over taps characteristic of the MOATS and MOATS-X configurations, the corresponding parameters are: $\delta L_{AB-A}$, the bridge electrical length shortening caused by a tap extending from both sides of the bridge but measured from the "A" side of the bridge and $\delta L_{AB-B}$, the bridge electrical length shortening caused by a tap extending from both sides of the bridge, but measured from the "B" side of the bridge.

Multiple examples of this composite test structure were located on a single test chip. Bridge lengths, L, were 8 and 12 μm. Bridge linewidths, $W_B$, were 1 and 2 μm, and tap linewidths, $W_T$, were 1, 2, and 4 μm. The built-in offsets, $X_{DRWN}$, were ±0.50, ±0.25, and 0.0 μm. The test chip was printed on a 10× master chrome mask by an electron pattern generator system with a 0.1-μm by 0.1- μm pixel size. The master was then stepped across two bright chrome masks, at 10× reduction and 10 -mm stepping distances with an optical tool.

The data reported herein are extracted from the structures with L =12 μm, $W_T$=2 μm, and $W_B$=1 μm. Data were taken from five composite structures (one exhibiting each value of $X_{DRWN}$) at two orientations, hereafter referred to as vertical and horizontal, and four chip sites on each of the two substrates, for a total of 80 composite structures. The structures were tested by forcing a test current through the bridge and measuring voltages at appropriate pads tapping into the bridge along its length.

The effective shortening of the length of the bridge segment per voltage tap, $\delta L$, was calculated following the following procedure. A voltage drop $V_1$ is measured across a first segment of the bridge having no intermediate taps, and of length $L_1$, where $L_1$ is the center-to-center separation of the corresponding voltage taps. The voltage drop $V_2$ induced by the same bridge current across a companion pair of taps with center-to-center spacing $L_2$ (equal to $L_1$) defining a second bridge segment is likewise measured, the second bridge segment having a number n of "dummy" voltage taps, such as shown at 36 in FIGS. 4. To ensure that proximity effects do not adversely affect the measurements, the spacing of the "dummy" taps is chosen to be L/2; that is, the spacing of the dummy taps was equal to one-half the length L of the third segment of the bridge 34 between the taps and connecting pads P2 and P3 to the bridge B, i.e., defining the end-tap-to-center-tap spacing of the potentiometer structure. For the extraction of $\delta L$ to properly apply to the active region of the potentiometer, the design linewidths of the taps and the bridge are equal throughout.

For a constant current along the bridge, $\delta L$ is then calculated using the expression $$\delta L = \left( \frac{L_1 V_2 - L_2 V_1}{nV_1 + (V_1 - V_2)} \right) \quad (7)$$

where $V_1$ is the voltage between the center pad $P_1$ and one end pad $P_2$; $V_2$ is the voltage between $P_1$ and the opposite end pad $P_3$; and n is the number of dummy taps. As mentioned previously, four different values of δL may be extracted in this way: $δL_A$, $δL_B$, $δL_{AB-A}$, and $δ_{AB-B}$, by appropriate choice of the connecting pads.

The offset $X_{MEAS}$ of the structure was measured in two ISIS configurations (those which the model predicts are vulnerable to systematic errors due to asymmetrical ICR), namely, the simple ISIS, shown in FIGS. 4 and 9(a), and the ISIS, defined by the asterisked pads on the MOATS-X configuration of FIG. 9(d). Values of $X_{MEAS}$, calculated from Eq. (3) for a single composite structure on one chip, are shown for the ISIS and ISIS* structures (each having been produced in "A" and "B" examples, as indicated) in FIG. 10. The values of $X_{MEAS}$ were determined by setting Δt=0, in lieu of its precise value which is not known, while using the appropriate values of δL. The improvement afforded simply by the cross-over taps in ISIS* is clearly achieved, in that the y-intercept of the curve of $X_{MEAS}$ versus $X_{DRWN}$ (which ideally should be zero) is substantially reduced for the ISIS* data as compared to the ISIS data shown; however, also as expected, even the ISIS* configuration does not entirely eliminate the systematic error represented by the y-intercept, due to placement of the central tap $P_1$ on the opposite side of the bridge from the end taps $P_2$ and $P_3$.

To measure an unknown offset using either ISIS or ISIS*, one must still first determine by measurement the intercept of the curve of $x_{MEAS}$ versus $x_{DRWN}$, that is, essentially the quantity $x_o$ in Eq. (6). This serves as a calibration, allowing subsequent employment of Eq. (4) (for example) to determine the unknown value of x of another, separate, test structure. However, neither the ISIS nor the ISIS* configurations are satisfactory for determining unknown x values. This is because the electron beam spot size causes an uncertainty in the placement of the features of at least ±10 nm affecting the output of the primary pattern generator and resulting in an uncertainty in the value of $X_{DRWN}$.

The YAMA and MOATS structures, wherein the central tap is on the same side of the bridge as the end taps, avoid this problem. Data comparable to that provided for the ISIS and ISIS* structures in FIG. 10 is presented for the YAMA and MOATS structures in FIG. 11. Again, two examples ("A" and "B") were tested. The y-intercepts of the curves of $X_{MEAS}$ versus $X_{DRWN}$ are of the order of only 15 nm, consistent with the uncertainty in feature placement by the primary pattern generation tool.

Figure 11:
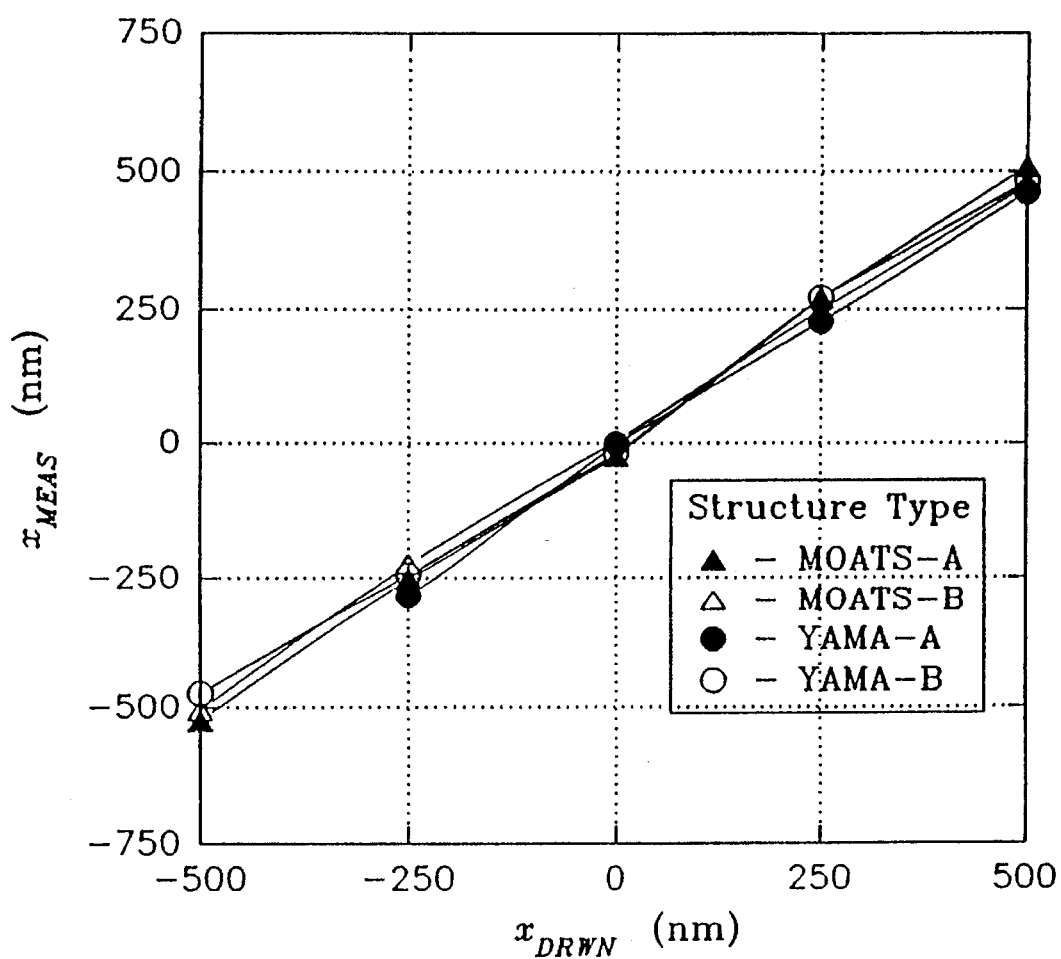
FIG. 11 is a graph comparable to FIG. 10, showing data determined in testing the structures of FIGS. 9(b) and (c)

In practical applications, therefore, the YAMA and MOATS configurations are preferred over the ISIS structure; as the systematic error is eliminated as shown by FIG. 11, the need for determination of $x_o$ for calibration purposes as described above is eliminated.

Measurements from the two different sides of the same MOATS-X structure were also compared. If the primary pattern generator were able to create geometrically perfect voltage-tap cross-overs, then the same value of x for voltages measured from either side of the structure should be obtained because the ΔLs on opposite sides of the wires would be equal, and Δt and δt would be zero. Furthermore, since the same physical offset is being measured along the same length of the same bridge, there is no possibility that variations in the width of the bridge and/or of the taps would introduce spurious values of the offset. Therefore, the two measurements should give exactly the same results.

Experiment indicates that, for all sites and for all structures, the differences between measurements of the same offset x, as measured using voltage taps on the two opposite sides of the bridge, was only 7±6 nm. The value of 7 nm included instrumental error, which should be reducible through improved measurement technique, and is responsive to random patterning errors that limit the baseline capabilities of this structure for a particular fabrication technique to a minimum value estimated to be 5 nm.

FIG. 12 shows an exemplary layout for an integrated circuit water 64 employing several test structures 62 according to the invention at each of a plurality of chip sites 66, and incorporating further improvements in the method and test structure of the invention as provided by the present continuation-in-part application. FIGS. 13(a)-(c) show exemplary test structures illustrating respectively comparable views of such a test structure as designed, an exemplary test structure as might result from a net feature misplacement, i.e., a mask pattern generation error, and a further test structure as might result from a mask misregistration error between first and second patterning operations.

More specifically, FIG. 13(a) shows an exemplary desired test structure manufactured correctly, that is, without "local" pattern generation errors or mask misalignment errors. The test structure comprises a bridge conductor 50 formed together with taps 52, 54, and 56 in a single patterning operation, such that under normal circumstances they are very precisely located with respect to one another. For example, if a current is forced along the bridge conductor 50, voltages can be measured across pairs of taps 52 and 56 and 54 and 56 so as to ensure that the width of the bridge conductor is consistent. In a subsequent patterning operation, a further crossing tap 58 and a tap 60 are added, such that FIG. 13(a) shows the taps 58 and 60 in their intended positions.

If it is assumed that the portion of the mask (or other tool) used for the second patterning operation exhibits a "local" error, such that the mask section employed to form tap 60 is displaced, the test structure shown in FIG. 13(b) might result, i.e., wherein the tap 60 is displaced from its intended position indicated by dashed line 60'. As discussed above, in a measurement of the offset of tap 60, this error will be detected in that comparison of voltage drops between, for example, pairs of taps 56 and 60, and 54 and 60, will exhibit the displacement of tap 60 from its desired position as indicated by the dotted line 60'.

By comparison, if the entire mask used in the second patterning operation to form taps 58 and 60 is misaligned with respect to the previously formed portion of the test structure comprising bridge conductor 50 and taps 52, 54, and 56, the erroneous test structure shown in FIG. 13(c) might result, i.e., wherein tap 58 is displaced from its normal position 58' and tap 60 is also displaced from its position 60', by an equal amount of offset. If the mask is used in a single step to form structures over the entire chip site, the error will occur over the entire chip site, i.e., a common "tool-wide" error will appear in the formation of all features formed in a given step by the misaligned tool.

According to the present invention, such tool-wide and local errors can be distinguished by offset measurement. The offsets exhibited by the test structure exhibiting local errors as exemplified by the pattern of FIG. 13(b) and the test structure exhibiting tool-wide errors with FIG. 13(c) are distinguishable from one another according to the invention, such that the corresponding faults in the manufacturing process can be identified and addressed.

As shown in FIG. 12, according to this aspect of the invention, a number of substantially identical test structures indicated generally at 62 may be formed at each of a plurality of chip site 66 on an integrated circuit water 64, i.e., as part of a full-scale manufacturing process, or as part of a prototype process or the like. Further, it will be appreciated by those of skill in the art that normally the area of the wafer 64 occupied by the test structures 62 will be much smaller; the test structures are shown at large scale in FIG. 12 to enable their illustration. The test structures 62 will be formed using the same tools at each chip site 66 on the wafer 64, the tools being moved from chip site to chip site.

In the example of FIG. 12, twenty-five groups of three essentially identical test structures 62 are provided one group at each chip site 66. The test structures 62 may be as discussed above, e.g., in connection with FIG. 4, as discussed below in connection with FIG. 14, or otherwise. According to the present aspect of the invention, however, the overlay $0'_{ij}$ of a particular test structure formed in differing manufacturing operations is measured with respect to each of the test structures 62, and is used as the input to a process whereby the least-squares sum S of the measured overlays $0'_{ij}$ is calculated to determine values for mask misalignment errors $M_i$ and pattern errors $P_j$ at each location.

More specifically, for a substrate having $N_s$ total sites, each having $N_p$ test structures (e.g., where 3 test structures are formed at each of 25 chip sites, $N_s=25$ and $N_p=3$, such that 75 total structures are formed) the contributions of tool wide misalignment $M_i$ and of local tool fabrication error $P_j$ are defined to be those which minimize the quantity S, as follows:

$$S = \sum_{i=1}^{N_s} \sum_{j=1}^{N_p} (0_{ij}' - M_i - P_j)^2 \quad (8)$$

where $0'_{ij}$ is the overlay measured with respect to the structure identified by i and j, i.e., the j-th structure at the i-th chip site.

According to this equation, as appreciated by those of skill in the art, the sum S of the squares of the errors is minimized, resulting in an actual value $0_{ij}$ for the overlay of each structure, and yielding values for the actual tool-wide errors $M_i$ and local errors $P_j$, i.e., differentiating the tool misalignment errors $M_i$ and pattern errors $P_j$. In this analysis, the total overlay $0'_{ij}$ measured with respect to any particular test structure 62 is the sum of the contribution $M_i$ due to misalignment of a tool used in a subsequent patterning operation with respect to a structure formed in a prior patterning operation, and the contribution $P_j$ of errors in the individual tool with respect to other portions of the individual tool.

Stated more generally, the $M_i$ contributions to $0'_{ij}$ for all test structures formed in a single operation at a given chip site 66 are tool-wide: that is, the overlay $0'_{ij}$ measured with respect to each test structure formed in a particular operation will exhibit the same contribution $M_i$ due to a misregistration of a tool used for a subsequent operation with respect to a structure formed in a previous operation. The $P_j$ terms in $0'_{ij}$ are local, that is, if a portion of the tool is manufactured improperly, such that a particular feature is displaced with respect to the remainder of the tool, that error will only affect the corresponding test structure at each chip site 66.

According to an important aspect of the invention, the same tool is used to form a portion of the test structure added to previously-formed portions of test structures at each of a plurality of chip site 66, so that the local error $P_j$ is systematic, appearing at the same respective location in a plurality of sets of test structures. This enables the least squares analysis discussed above to separate out tool-wide errors $M_i$ from local pattern manufacturing errors $P_j$.

For example, in FIG. 12, twenty-five groups each of three nominally identical test structures are formed on wafer 64. The same mask is used twenty-five times (i.e., $N_s=25$), to form portions of three test structures (i.e., $N_p=3$) previously formed at each location. Therefore, if one of the three test structure generators used at each of the twenty-five chip sites 66 locations exhibits a pattern error, the same contribution $P_j$ will be contributed to the measured overlay $0'_{ij}$ measured with respect to the same respective one of the three test structures of each of the twenty-five groups of test structures. Conversely, if the overall mask used to form one of the twenty-five groups of test structures is misaligned, each of the three overlays $0'_{ij}$ measured with respect to that group of three test structures will include the same contribution $M_i$.

Referring back to FIGS. 13(a)–(c), if the measured overlay $0'_{ij}$ is due to an error in the pattern, the FIG. 13(b) pattern will result at each of twenty-five corresponding locations, while if the error is one of overall mask misalignment, the FIG. 13(c) pattern will result at each of the three locations at one of the twenty-five overall test locations. The fact that the two types of errors thus contribute differently to the overall measured overlay $0'_{ij}$ allows tool misalignment errors $M_i$ to be separated from pattern manufacturing errors $P_j$, by minimization of S in Eq. (8) as discussed above.

Employment of a large number of nominally identical test structures at each chip site as just discussed has a further advantage. Reference was made in the above to the well known fact that semiconductor processing operations inevitably suffer defects due to the presence of dust on masks and like tools, or on the substrate. For example, if a particle of dust adheres to the substrate at a point where a conductor is to be formed, the conductor may be formed with a portion missing. On the other hand, if a particle of dust adheres to a mask intended to pattern a photoresist, a conductor may be formed having a wider portion than desired. Either can result in the conductor's length being measured erroneously, that is, an incorrect overlay may be detected.

According to the invention, however, a large number of essentially identical test structures are formed, and the measured overlays $0'_{ij}$ from each are summed and used to separate out the mask misalignment errors $M_i$ and the pattern fabrication errors $P_j$, as discussed above. The process of summing over a large number of substantially identical test structures has the effect of averaging out any errors due to dust or the like; such errors will by their nature be random, and will normally have effect only on the formation of a single test structure. On the other hand, a particle of dust adhering to a tool when used in repetitive operations, such that the same feature is formed improperly at a number of locations, will be correctly detected as a problem with the tool, i.e., as a source of $P_j$ error.

The processing technique discussed above, again, amounting to summing over the measured overlays $0'_{ij}$ to determine $M_i$ and $P_j$ for each of a large number of test structures, thus not only allows effective differentiation between tool alignment errors and tool fabrication errors but also eliminates the effect of individual particles of dust which might otherwise disturb the offset measurements being made.

More particularly, according to one aspect of the invention, at least three substantially identical test structures are formed at each location, for the following reason. Tool misalignment errors and tool fabrication errors can be distinguished from one another in theory using only two identical test structures, i.e., comparison of the FIG. 13(b) error with the FIG. 13(c) error is sufficient in most cases to distinguish mask alignment from pattern manufacturing errors. However, dust or the like on one of the tools used to form one part of the structure will result in an overlay being measured that is not distinguishable from pattern errors or mask alignment errors. The random presence of the dust particles will normally cause the dust to cause a length measurement error to be detected with respect to but a single test structure, such that if at least three structures are used at each location, this error will average out over a plurality of identical structures. Therefore, it is preferable to provide at least three substantially identical test structures at each location; as indicated in FIG. 12, it is better still to provide a larger number of groups of substantially identical test structures, such that line length measurement errors caused by dust are averaged over a much larger number of test structures, allowing the mask alignment errors and pattern fabrication errors to be distinguished from one another.

As shown schematically in FIG. 12, such multiple test structures consume a substantial amount of the available substrate area; although FIG. 12 shows the test structures rather larger than would normally be the case, it still would be desirable to reduce the test structure size insofar as possible.

FIG. 14 shows a test structure allowing several independent test structures effectively to be formed at a single location; the test structure of FIG. 14 might be employed at each of nine locations in FIG. 12. In essence, the test structure of FIG. 14 employs the same bridge conductor for two or more separate measurements of the offset x. (As noted above, in many cases this offset x will coincide with the overlay 0.) In each step the conductor shortening effect introduced by the presence of taps is first determined, and the local offset generated with respect to a particular pair of operations patterning is determined. The structure of FIG. 14 allows plural such measurements to be made with respect to a single portion of the bridge conductor, this being divided into several different segments, such that a particular tap may serve as a dummy tap in a first overlay measuring step, i.e., allowing the conductor shortening effect to be measured in the first offset measuring step, using the method discussed above, and thereafter to serve as a tap for overlay measurement in a subsequent measuring step, in which other taps serve as dummy taps. The function of individual taps therefore varies in successive measuring steps. The structure of FIG. 14 thus allows the benefits of use of a plurality of essentially identical test structures to be obtained at a minimum cost in terms of substrate area consumed thereby.

The FIG. 14 test structure is again used for making electrical measurements of the lengths of segments of a bridge conductor by driving a current along the bridge and measuring the voltage drop at ends of the various segments; again, a first portion of the test structure is formed on an insulative substrate in a first operation, and the offset of a second portion added in a subsequent operation is then measured. Specifically, a bridge conductor 70 extends between pads 7 and 8, through which the current is forced. Taps 72, 74, 76, and 78 are formed in the same "Level 1" processing step; as indicated, tap 72 is connected to pad 1, tap 74 to pad 3, tap 76 to pad 5, and tap 78 to pad 6. Further, taps 72 and 76 are provided with imaging metrology extensions A and B extending to the other side of bridge conductor 70, to provide a convenient point at which the respective locations of taps 72, 76 can be measured using an optical microscope, interferometer, or other nonelectrical instrument, for reasons discussed below. After deposition of the Level 1 material, a second Level 2 portion of the structure is added, comprising taps 80 and 82 connected respectively to pads 2 and 4 and provided with imaging metrology extensions C and D. All voltage drop measurements are preferably made from the same side of bridge conductor 70 to substantially eliminate differential inside-corner-rounding effects, as above.

After measurements of appropriate voltage drops (e.g., $V_{56}$ being the voltage drop measured across pads 5 and 6), and with segment lengths $L_1$, $L_2$, and $L_3$ defined as indicated on FIG. 14, the bridge shortening parameters $\Delta_1$ and $\Delta_2$ can be determined from the following equations:

$$\frac{V_{56}}{V_{24}} = \frac{L_3 - \Delta_1}{L_2 - (\Delta_1 + \Delta_2)} \tag{9}$$

and $$\frac{2*V_{56}}{V_{13} + V_{15}} = \frac{L_3 - \Delta_1}{L_1 - (\Delta_1 + \Delta_2)} \tag{10}$$

Note that in the calculation of Eq. (9), the parameters $\Delta_1$ and $\Delta_2$ are calculated by comparison of $V_{56}$, measured between Level 1 taps, and $V_{24}$, measured between Level 2 taps. In this calculation tap 74, located between taps 80 and 82, is treated as the dummy tap. In Eq. (10) taps 80 and 82, located between the taps with respect to which the voltages are measured, serve as the dummy taps. Thus, it will be appreciated that a tap treated as a dummy tap in one particular process for measuring the conductor-shortening effect may be employed as a voltage measuring tap in a subsequent similar process.

In the event there is overlay due to a misalignment of the tool used to image the Level 2 features, taps 80 and 82 will be displaced to one side (for example) as will the corresponding imaging metrology extensions C and D. FIG. 15 shows an enlarged portion of the structure of FIG. 14 showing the offset $x_{123}$ of tap 80 formed in Level 2 from its designed position between taps 72 and 74 formed as part of Level 1. FIG. 15 also illustrates typical corner rounding effects, i.e., broadening of the conductors where they cross, and identifies the terminology used in the equations which follow.

The offset $x_{123}$ is calculated by the analog of Eq. (4) above, as follows:

$$x_{123} = \left( \frac{V_{12} - V_{23}}{V_{12} + V_{23}} \right) \left( \frac{L_1 - (\Delta_1 + \Delta_2)}{2} \right) + \Delta t \tag{11}$$

where $$\Delta t = (\delta t_1 - \delta t_2) \tag{12}$$

In Eq. (12), $\delta_1$ is the distance from the physical center lines of the taps 70 and 74 formed in Level 1 from their corresponding electrical center points, that is, the conductor shortening effect represented by $\delta_1$ is the difference between the physical center lines and the electrical center lines. The sign of $\delta_1$ is positive in Eq. (12) when the electrical center lines are to the right of the physical center lines of the corresponding taps. Similarly, the sign of $\delta t_2$, the corresponding conductor-shortening effect occurring with respect to tap 80 added in Level 2, is positive when its electrical center line is located to the right of its physical center line, and the sign of offset $x_{123}$ is positive when the physical center line of the center tap 80 is to the right of the midpoint of the physical center lines of the end taps 72 and 74.

According to a further aspect of the invention, the test structure of FIG. 14 can be used to make several measurements of the overlay made by calculations as above with respect to differing combinations of the taps added in the Level 1 and Level 2 processes. More specifically, FIG. 15 illustrates the manner whereby the structure of FIG. 14 can be divided into a subportion including taps connected to pads 1, 2, and 3 for determination of offset $x_{123}$. The same process can be carried out with respect to pads 2, 3, and 4 and pads 3, 4, and 5. The effect is to separately calculate the offset of a central tap with respect to end taps. Note that in processing the voltages measured with respect to pads 1, 2, and 3, that is, to calculate the offset $x_{123}$ of tap 80 added as part of Level 2, the offset is measured for a Level 2 tap; the same is true in calculation of offset $x_{345}$. In calculation of offset $x_{234}$, however, a Level 1 tap 74 is treated as the tap exhibiting offset. Accordingly, offset common to both taps 80 and 82 added in a subsequent processing operation will make different contributions to the total measured overlay than when only tap 80 is part of the measurement, i.e., in Eq. (11) above, or when only one of the Level 2 taps exhibits offset, e.g., due to a local error in the Level 2 processing tool. The net effect is to allow differentiation of contribution of tool misalignment and tool fabrication errors in the measured overlay.

Reference was made in the foregoing to use of the invention in calibration of imaging tools for overlay measurement. These tools are generally optical tools such as optical microscopes or the like which effectively measure the spacing between relative conductive features on a test structure by optical inspection methods. These tools are known to be subject to systematic errors called "shifts", including so-called "tool-induced shift" referring to the measuring tool's alignment, and to "wafer-induced shifts" caused by certain characteristics of the pattern under inspection. Tool-induced shifts are estimated or reducible only by repeating measurements after reorientation of the substrate being inspected, while wafer-induced shifts are estimated as part of a calibration exercise involving patterns having known overlay.

Overlay reference test patterns for imaging metrology tool calibration are not conveniently available. This is for two reasons. First, the only sources of reliable primary calibration are one-of-a-kind national resources such as the line scale interferometer coordinate measurement system of the National Institute of Standards and Technology, which is not suited for volume manufacturing. Further, wafer-induced shifts are process-dependent such that the reference material needs to be manufactured in the same way as the patterns that are being inspected. In other words, a common reference standard would only be useful with a single type of wafer fabrication process.

By comparison, electrical overlay metrology as described herein, that is, using electrical measurements carried out on test structures, does not suffer from the measuring tool-induced shift common to imaging metrology. Further, electrical overlay metrology as disclosed herein is fast and inexpensive and can be very effective in process evaluation. Its usefulness is limited to a degree by the fact that the electrical test structure has to be replicated in electrically-conductive material. This limits its utility to conductive materials; i.e., structures formed of photoresist, oxide layers, and like nonconductive materials cannot be directly evaluated.

According to recent results of the inventors, it has been found that measurement of lengths of conductive materials using electrical metrology techniques as disclosed herein are so closely comparable to those measured by the line scale interferometer as to suggest that electrical metrology can serve as an interface between the line scale interferometer absolute length-scale reference instrument and existing optical metrology equipment. That is, the prior art provides no economically feasible means for conveniently calibrating an optical metrology tool as conventionally available to an absolute length-scale reference, such as the line-scale interferometer; electrical metrology techniques according to the invention can satisfy this need.

More particularly, an electrical test structure according to the invention, employing the techniques disclosed herein for correctly compensating electrical measurements for such features as inside corner rounding and conductor length shortening due to the presence of taps as disclosed herein is useful in calibrating optical instruments for overlay measurement. One method for so doing is generally as follows.

Imaging metrology estimates of overlay are first derived using conventional imaging metrology techniques; that is, the physical positions of the extensions A–D (these constituting a conventional "bars in bars" or "frame in frame" imaging overlay measurement pattern) aligned with the electrical voltage taps shown in FIG. 14 are optically compared to their design positions to yield a number of optically-measured overlays $(0^{\phi}_{ij})'$. Overlays $(0^{\phi}_{ij})'$ may include local or tool-wide contribution as in the case of the comparable electrical measurements. The optical overlay measurements $(0^{\phi}_{ij})'$ are used as described above for the case of the comparable electrical measurements $(0^{e}_{ij})'$ to extract estimates of $M^{\phi}_i$ and $P^{\phi}_j$ used in turn to re-estimate the actual optically-measured overlays ($0^{\phi}_{ij}$).

Next, comparable overlays $(0^{e}_{ij})'$ are measured electrically, and used as above to extract the $M^{e}_i$ and $P^{e}_j$ values used in turn to re-estimate the actual overlays $0^{e}_{ij}$.

A measurement algorithm is thus used defining the net feature misplacement contributions to both overlays $P_j$ such that their sums are zero; that is, it is assumed the $P_j$ contributions due to tool fabrication errors are essentially random, so that their net contribution to $(0_{ij}^{e})'$ and $(0^{\phi}_{ij})'$ is zero. Therefore, if there are tool-induced or wafer-induced shifts in either set of overlay measurements, they behave so as to contribute constant amounts $S^e$ and $S^{\phi}$ to the actual misregistrations $M_i$ extracted from the respective sets of overlay measurements. Thus, according to this aspect of the invention, comparable contributions to the overlays are reconstructed from electrically measured overlays $(0^{e}_{ij})'$ and from imaging metrology measurement overlays $(0^{\phi}_{ij})'$. The electrically measured overlays are thus generally $(0_{ij}^{e})'=M_i+P^e_j+S^e+\delta_{ij}$ where $\delta_{ij}$ is the residual random error, while the optically measured overlay $(0^{\phi}_{ij})'=M_i+P^{\phi}_j+S^{\phi}+S^{\phi}_{ij}$.

As above, minimizing the sums of the squares of the electrical residual errors provides estimates of $M^e_i=(M_i+S^e)$ and $P^e_j$, and $M^{\phi}_i=(M_i+S^{\phi})$ and $P^{\phi}_j$. $S^e-S^{\phi}$, that is, the difference between the shift measured using electrical techniques and the shift measured using imaging metrology techniques, is the quantity needed for cross-referencing the two techniques. This quantity is equal to the average difference between the $(M_i+S^e)$ and the $(M_i+S^{\phi})$ parameters extracted in separate least-square regression techniques.

Put in another way, according to the invention, actual values for the overlay $0^e_i$ measured electrically can be determined by separating out tool-wide errors $M_i$ and local tool fabrication errors $P_j$. The tool misalignment errors $M_i$ are common to both optical and electrical measurements while the $P^e_j$ and $P^{\phi}_j$ values may differ (the optical measurements are generally insensitive to local variation in conductor width detected by electrical measurements). Accordingly, the net shift $S^e$ measured using electrical techniques can be compared to the net shift $S^{\phi}$ measured using optical inspection techniques, and used to calibrate the optical equipment.

Therefore, according to the invention a test structure is provided the integrity of which is measured electrically and which is also inspectable by imaging metrology tools. In a further embodiment, a number of test structures each exhibiting various values for overlay could be examined to determine which in fact provides the shortest conducting paths between two pads, i.e., electrical techniques can be used to determine the actual overlay. This result could then be correlated with measurements made in the same structure using optical techniques to calibrate the optical instrument.

Additional correlation techniques made possible by the result that electrical measurements made according to the invention yield actual measurements of length comparable to those measured using interferometric techniques not available in ordinary manufacturing processes will occur to those of skill in the art.

Thus, there has been shown and described an improved process and electrical test structure for submicrometer feature metrology which accomplishes all of the objects of the invention mentioned above.

While the invention has been described with a certain degree of particularity and with respect to certain preferred embodiments thereof, it is manifest that many changes may be made in the details of construction and the arrangement of components without departing from the spirit and scope of the disclosure. It is understood that the invention is not limited to the embodiments set forth herein, but is to be limited only by the scope of the appended claims including the full range of equivalency to which each element thereof is entitled.

What is claimed is:

1. An improved test structure for providing a plurality of offset measurements of a first portion of a test structure formed in a first operation with respect to a second portion of said structure formed in a subsequent operation, said test structure comprising:

an elongated bridge conductor with taps at either end for forcing a current therethrough;

a first plurality of taps intersecting said bridge conductor at intervals, said taps being connected to pads for measurement of voltage drops along a first group of nonoverlapping contiguous segments of said bridge conductor defined by the intersection of said taps and said bridge conductor, said first plurality of taps being formed in the same operation as said bridge conductor, a second plurality of taps formed in a second operation and intersecting said bridge conductor, said second plurality of taps also being connected to pads for measurement of voltage drops along a second group of nonoverlapping contiguous segments of said bridge conductor defined by said second set of taps, said first and second groups of segments including common portions of said bridge conductor, wherein in use the respective offsets of the second set of taps with respect to the first set of taps are measured by comparison of voltage drops along said bridge conductor with respect to a plurality of intersections of taps formed in said second processing operation, and whereby errors common to the positions of all of the taps of said second set of taps with respect to said first plurality of taps can be effectively distinguished from errors in the position of one or more of said taps formed in said second operation.

2. The test structure of claim 1, wherein a plurality of identical such test structures are formed at spaced locations on a semiconductor substrate, wherein the same tool is used to form the second plurality of taps at each of said plurality of locations, whereby errors in fabrication of said tool used to form said test structures provides a systematic error distinguishable from errors due to misalignment of tools used in said first and second processing operations.

3. The test structure of claim 1, wherein said taps extend transversely across said bridge conductor for optical measurement of their respective spacing.

* * * * *